(12) United States Patent
Schott et al.

(10) Patent No.: US 7,064,567 B2
(45) Date of Patent: Jun. 20, 2006

(54) INTERPOSER PROBE AND METHOD FOR TESTING

(75) Inventors: Donald Earl Schott, Colorado Springs, CO (US); Brent Anthony Holcombe, Colorado Springs, CO (US); Peter Joseph Martinez, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/916,706

(22) Filed: Aug. 12, 2004

(65) Prior Publication Data

US 2006/0033512 A1    Feb. 16, 2006

(51) Int. Cl.
*G01R 1/073* (2006.01)
*G01R 31/02* (2006.01)

(52) U.S. Cl. ........................... 324/754; 324/755
(58) Field of Classification Search ............ None
See application file for complete search history.

(56) References Cited

U.S. PATENT DOCUMENTS

| 4,853,626 | A | * | 8/1989 | Resler .................. 324/754 |
| 4,912,401 | A | * | 3/1990 | Nady et al. .............. 324/755 |
| 4,997,377 | A | * | 3/1991 | Goto et al. .............. 439/68 |
| 5,859,538 | A | * | 1/1999 | Self ................... 324/755 |
| 5,896,037 | A | * | 4/1999 | Kudla et al. ............ 324/755 |
| 6,144,559 | A | * | 11/2000 | Johnson et al. .......... 361/760 |

* cited by examiner

*Primary Examiner*—Ernest Karlsen (57) ABSTRACT

An interposer probe includes a main board having a first side and a second side. A lower riser board mounted to the first side of the main board and in electrical contact therewith is configured to engage an integrated circuit socket on a device to be tested. An upper riser board mounted to the second side of said main board and in electrical contact therewith, is configured to receive an integrated circuit package. A retention frame mounted to the first side of said main board engages the integrated circuit socket on the device to be tested.

20 Claims, 6 Drawing Sheets

INTERPOSER PROBE AND METHOD FOR TESTING

TECHNICAL FIELD

This invention relates to circuit test apparatus in general and more specifically to test apparatus for testing integrated circuit packages.

BACKGROUND

Circuit testers for testing electronic devices or systems are well-known in the art and are typically used to test one or more operational states of such electronic devices or systems. For example, a circuit tester may be used to test an electronic system after fabrication but before final assembly to ensure that the various circuits and devices comprising the system function properly. Alternatively, other test scenarios are also used.

Generally speaking, circuit testers operate by electrically connecting to various circuit nodes of the electronic system. For example, in one testing procedure, electronic signals are detected or probed by the circuit tester. The detected signals are then analyzed by an analyzer associated with the circuit tester. In another type of testing procedure, the circuit analyzer may generate an electronic signal that is then "injected" into the appropriate circuit node. The response of the device may then be analyzed.

Regardless of the particular testing procedure that may be used by the circuit tester, some means must be provided to electrically connect the circuit tester to the device to be tested. In perhaps the most simple embodiment, one or more elongate, needle-like test probes are positioned by hand to contact the appropriate circuit nodes. More commonly, however, the probing apparatus tends to be considerably more complex, such as the so-called "bed-of-nails" probes that are commonly used to simultaneously probe tens, or even hundreds, of circuit nodes on a printed circuit board.

However, the increasing complexities of electronic systems are placing ever-increasing demands on test probe apparatus, from both mechanical and electrical standpoints. For example, it is not uncommon for current electronic systems to include one or more large scale integrated circuits having a very large number (e.g., hundreds) of contact points or nodes. While it may not be necessary to probe each and every contact point or circuit node, the mere fact that the nodes are increasing typically means an increase in the number of nodes that must be probed in order to effectively test the electronic system. In addition, the increasing clock speeds of digital systems means that the probing of the signals produced by such systems must be accomplished with as little mechanical and electrical impact as possible in order to ensure that the probing process itself does not adversely affect the operation of the system.

SUMMARY OF THE INVENTION

An interposer probe comprises a main board having a first side and a second side. A lower riser board mounted to the first side of the main board and in electrical contact therewith is configured to engage an integrated circuit socket on a device to be tested. An upper riser board mounted to the second side of said main board and in electrical contact therewith, is configured to receive an integrated circuit package. A retention frame mounted to the first side of said main board engages the integrated circuit socket on the device to be tested.

A method for testing a device having at least one integrated circuit socket comprises: Providing an interposer probe having a first side and a second side, the first side of the interposer probe having a lower riser board mounted thereto, the lower riser board being configured to be received by the integrated circuit socket on the device, the second side of the interposer probe having an integrated circuit socket thereon configured to receive an integrated circuit package; engaging the lower riser board of the interposer probe with the integrated circuit socket on the device; engaging the integrated circuit package with the integrated circuit socket on the interposer probe; and using the interposer probe to probe at least one electrical signal between the integrated circuit package and the device.

BRIEF DESCRIPTION OF THE DRAWINGS

Illustrative and presently preferred exemplary embodiments of the invention are shown in the drawings in which.

DETAILED DESCRIPTION OF THE PREFERRED EMBODIMENTS

Figure 1:
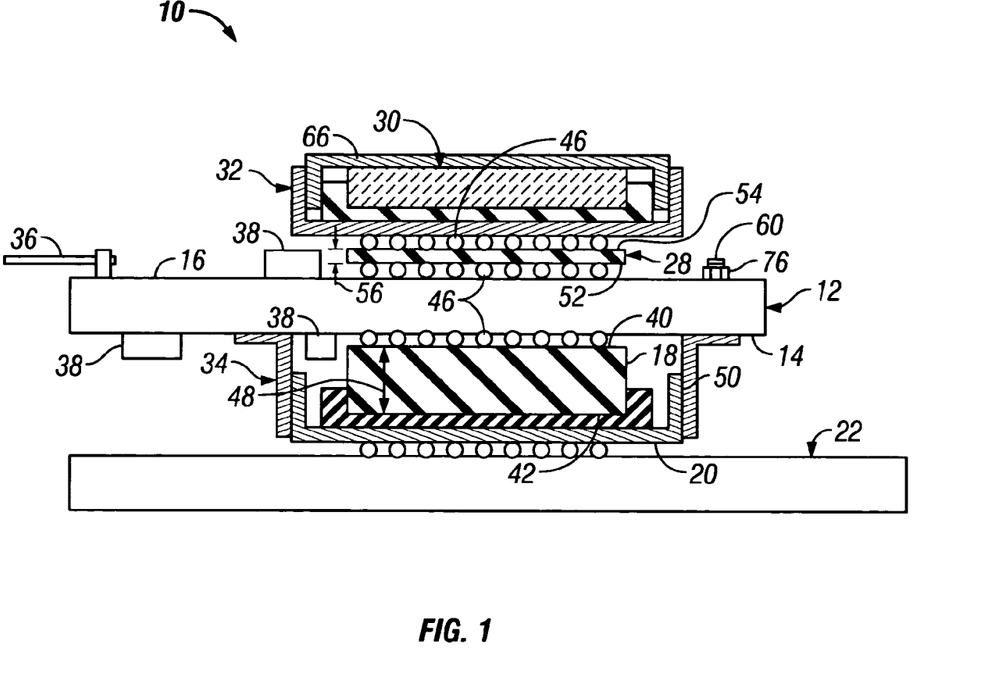
FIG. 1 is a side view in elevation of one embodiment of an interposer probe operatively engaged with a device to be tested.
Figure 2:
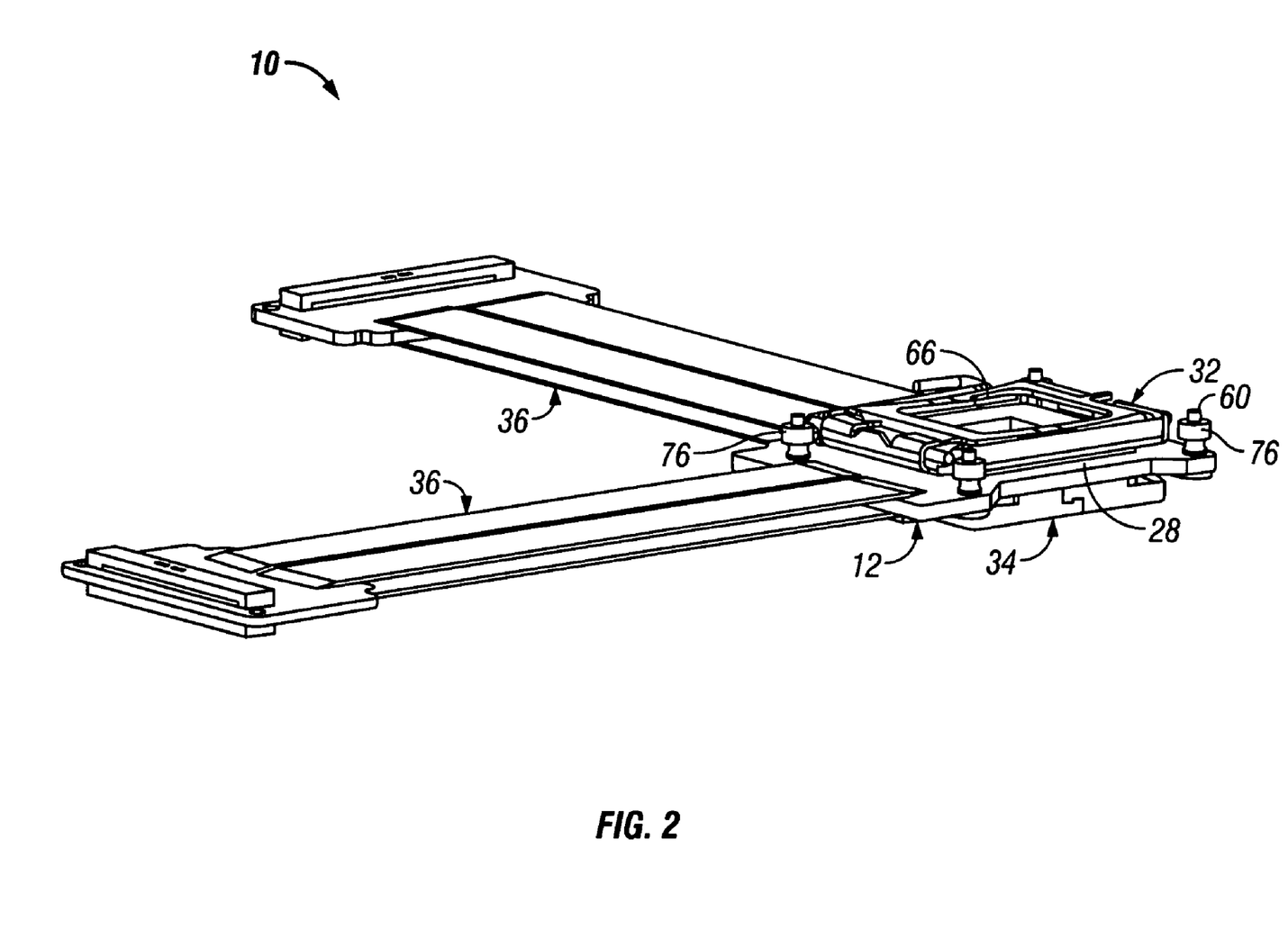
FIG. 2 is a perspective view of the top portion of the interposer probe illustrated in FIG. 1.
Figure 3:
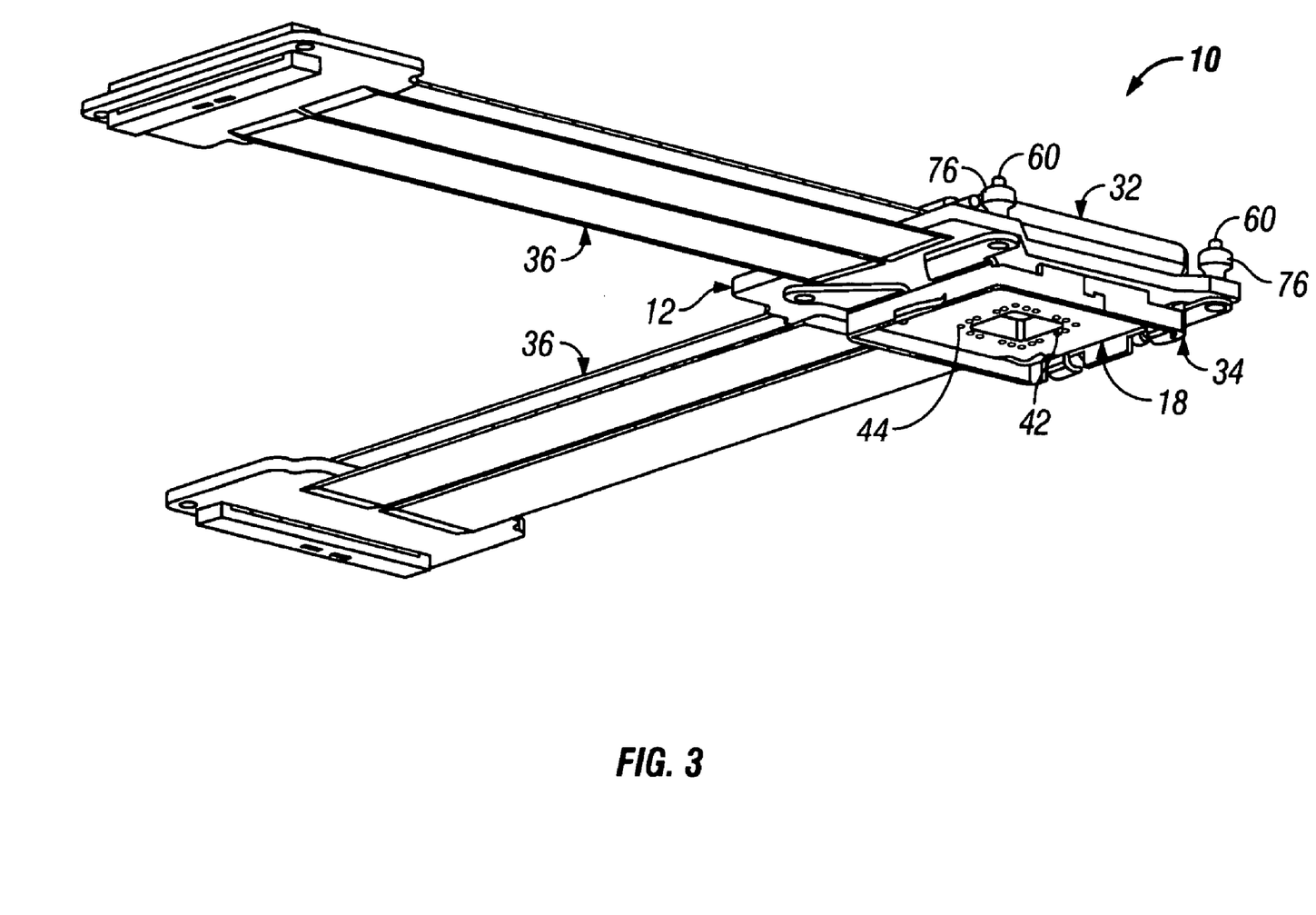
FIG. 3 is a perspective view of the lower portion of the interposer probe illustrated in FIG. 1.

An interposer probe 10 according to one embodiment of the present invention is best seen in FIGS. 1–3 and may comprise a main board 12 having a first side 14 and a second side 16. A lower riser board 18 is mounted to the first side 14 of the main board 12 so that the lower riser board 18 is in electrical contact with the main board 12. The lower riser board 18 is configured to engage an integrated circuit socket 20 provided on a device 22 to be tested. In the embodiment shown and described herein, the lower riser board 18 is provided with a plurality of contact pads 44 (FIG. 3) configured to make electrical contact with corresponding contact elements 26 (FIGS. 5 and 6) provided on the integrated circuit socket 20.

The interposer probe 10 also comprises an upper riser board 28 that is mounted to the second side 16 of the main board 12 so that the upper riser board 28 is in electrical contact with the main board 12. The upper riser board 28 is configured to receive an integrated circuit package 30 that would normally be positioned in the integrated circuit socket 20 of the device 22. In the embodiment shown and described herein, an integrated circuit socket 32 is mounted to the upper riser board 28 and is in electrical contact therewith. Thus, when the integrated circuit package 30 is positioned within the socket 32, the integrated circuit package 30 is electrically connected to the main board 12 via the integrated circuit socket 32 and upper riser board 28 in the manner that will be described in greater detail below.

The interposer probe 10 is also provided with a retention frame 34, as best seen in FIGS. 1 and 4–6. In the embodiment shown and described herein, the retention frame 34 is mounted to the first side 14 of the main board 12. The retention frame 34 is configured to engage the integrated circuit socket 20 provided on the device 22 to be tested.

The interposer probe 10 may be used to probe the device 22 to be tested by positioning the interposer probe 10 with respect to the device 22 so that the lower riser board 18 can be inserted into the integrated circuit socket 20 of the device 22. When fully inserted, the lower riser board 18 electrically connects the integrated circuit socket 20 of the device 22 with the main board 12. The retention frame 34 engages the integrated circuit socket 20 and holds the interposer probe 10 securely to the socket 20, i.e., so that the lower riser board 18 remains in electrical contact with the integrated circuit socket 20. The integrated circuit package 30 that normally would be received by the integrated circuit socket 20 on device 22 is instead inserted into the integrated circuit socket 32 of the interposer probe 10. Accordingly, the integrated circuit package 30 is electrically connected to the main board 12 (and device 22) via the upper riser board 28.

The main board 12 may be electrically connected to an external circuit tester or logic analyzer (not shown) via one or more cables 36 attached to the main board 12. Thereafter, the external circuit tester (not shown) may test the device 22 via the interposer probe 10 in accordance with one or more test procedures, as may be appropriate or desired for the particular device 22 to be tested.

A significant advantage of the interposer probe 10 of the present invention is that it provides a means for testing integrated circuits and devices that contain integrated circuits, but without the need to probe the circuit traces or contacts provided on the circuit board of the device. Indeed, because the interposer probe 10 interfaces directly with an integrated circuit socket provided on the printed circuit board, it is capable of probing all of the connection points between the integrated circuit package and the socket, should that be desired. Accordingly, the interposer probe 10 can be used with considerable advantage in devices that utilize high-density integrated circuit packages, such as land grid array (LGA) packages, that have proven difficult, if not impossible to probe via conventional probe apparatus (e.g., bed-of-nails probes) designed to probe the circuit traces or contacts provided on printed circuit boards. In addition, the interposer probe 10 may also be used without the need to modify or otherwise provide special features to the device 22 to receive the probe 10. Still another advantage of the interposer probe 10 is that its comparatively small physical size allows it to be used with systems where minimal space is available for probing. In addition, the minimal physical size reduces signal distortions that may be introduced in high frequency circuits by comparatively large probe elements. The interposer probe 10 may also be manufactured using common printed circuit board fabrication and assembly processes. Common mechanical machining and forming processes may also be used.

Having briefly described one embodiment of the interposer probe 10, as well as some of its more significant features and advantages, various exemplary embodiments of the interposer probe will now be described in detail. However, before proceeding with the description, it should be noted that the various embodiments of the interposer probe 10 are shown and described herein as they could be used in conjunction with integrated circuit packages (e.g., 30) and sockets (e.g., 20) of the land grid array (LGA) configuration. However, integrated circuit packages and sockets having other configurations that are currently available or that might be developed in the future could also be used with the present invention, as would become apparent to persons having ordinary skill in the art after having become familiar with the teachings provided herein. The interposer probe 10 is also described in the context of one particular test procedure that may be used to test the device 22 to be tested. However, other test procedures that are currently known or that may be developed in the future may also be implemented with the interposer probe 10 as well. Consequently, the interposer probe 10 should not be regarded as limited to use with the particular devices and with the particular test procedures shown and described herein.

Referring now to FIGS. 1–3, one embodiment of an interposer probe 10 may comprise a main board 12 having a first side 14 and a second side 16. The main board 12 provides the main structural support for the various other components and devices comprising the interposer probe 10 as herein described. In addition, the main board 12 may be provided with one or more electronic components or devices 38 that may be required or advantageous in conditioning or processing signals from the device 22 and/or the circuit tester apparatus (not shown) that may be operatively connected to the interposer probe 10 via cable 36. Alternatively, and depending on the particular test procedures that are to be formed, the entire circuit testing apparatus may be implemented via the components 38 provided on the main board 12. In still another alternative, the main board 12 may be "barren," i.e., devoid of any such circuit elements or components 38.

The electronic components or devices 38 that may be provided to the main board 12 will depend on the particular application for which the interposer probe 10 is to be used. For example, where a separate circuit tester or logic analyzer is used, the components 38 provided on the main board 12 may be required or desired to process or condition signals from the device 22 before they are sent to the external circuit tester. They may also be used to process or condition signals from the external circuit tester before being injected into the device 22. Alternatively, if the main board 12 is to provide all of the testing functions, then the components or devices 38 will comprise those components and devices necessary to carry-out the desired test procedure. Consequently, the interposer probe 10 should not be regarded as limited to a main board 12 having any particular type or kind of electronic components or devices 38.

If such electronic components or devices 38 are provided on the main board 12, they may be mounted to and electrically connected with the various conductive paths or circuit traces (not shown) provided on the main board 12 by any of a wide range of mounting technologies that are known in the art or that may be developed in the future. Consequently, the interposer probe 10 should not be regarded as limited to any particular mounting system or technology for any such components 38 that may be provided to the main board 12. However, by way of example, in one embodiment, the components 38 comprise surface mount components that may mounted to the main board 12 in accordance with any of a variety of surface mounting technologies that are known in the art.

The main board 12 may also be provided with a suitable mounting or interface system for allowing the lower and upper riser boards 18 and 28, respectively, to be mounted thereto and to be electrically connected with the appropriate conductors (i.e., signal paths) provided on the main board 12. By way of example, in one embodiment, the main board 12 is provided with a plurality of contact pads (not shown) that are compatible (e.g., from a material, size, and spacing standpoint) with the ball grid array (BGA) mounting system 46. The ball grid array (BGA) mounting system 46 is a mounting technology that is well-known in the art and could be readily provided by persons having ordinary skill in the art after having become familiar with the teachings provided herein. Consequently, the BGA mounting system 46 that may be utilized to mount to the main board 12 the lower and upper riser boards 18 and 28 will not be described in further detail herein.

The main board 12 may comprise any of a wide range of circuit board types (e.g., epoxy-glass) known in the art or that may be developed in the future that are or would be suitable for the intended application of the interposer probe 10. Consequently, the interposer probe 10 should not be regarded as limited to any particular type or style of main board 12. However, by way of example, in one embodiment, the main board 12 may comprise a multi-layer printed wiring board compatible with the BGA mounting system 46 used to attach the lower and upper riser boards 18 and 28. The main board 12 also may be designed to be compatible with the particular surface mount technology that is used to mount the various components 38 that may be provided on the main board 12.

Referring now primarily to FIGS. 1 and 3, the lower riser board 18 is mounted to the first side 14 of the main board 12. In the embodiment shown and described herein, the lower riser board 18 comprises a printed circuit board having a first side 40, a second side 42, and a thickness 48. The first side 40 is provided with a plurality of contact pads (not shown) that are compatible with the particular mounting system used to mount and electrically connect the contact pads (not shown) provided on the first side 40 of lower riser board 18 to the contact pads (not shown) provided on the first side 14 of main board 12. For example, in one embodiment wherein the first side 40 of the lower riser board 18 is mounted to the first side 14 of the main board 12 by the ball grid array (i.e., BGA) mounting system 46, the contact pads (not shown) provided on the first side 40 of lower riser board 18 are compatible (e.g., from a material, size, and spacing standpoint) with the BGA mounting system 46. However, because BGA mounting systems are well-known in the art and could be easily implemented by persons having ordinary skill in the art after having become familiar with the teachings provided herein, the details of the BGA mounting system 46 that may be used to mount the lower riser board 18 to the main board 12 will not be described in further detail herein.

The second side 42 of lower riser board 18 is provided with a plurality electrical contact pads 44 (FIG. 3) that are electrically connected to corresponding contact pads (not shown) provided on the first side 40 of the lower riser board 18. The electrical connections between the various contact pads provided on the first side 40 and the contact pads 44 on the second side 42 of lower riser board 18 may be provided by appropriate circuit paths or traces, such as plated throughholes (not shown), provided in the lower riser board 18. Stated simply, then, the lower riser board 18 comprises a circuit board or printed wiring board having contact pads provided on the first and second sides 40 and 42 thereof that are electrically connected together. Accordingly, lower riser board 18 may comprise any of a wide variety of printed wiring board types (e.g., epoxy-glass) fabricated in accordance with any of a wide range of processes known in the art or that may be developed in the future. Consequently, the lower riser board 18 that may be used in one example embodiment will not be described in further detail herein.

The contact pads 44 (FIG. 3) provided on the second side 42 of lower riser board 18 should be compatible with the particular integrated circuit socket 20 on the device 22 so that the contact pads 44 on the second side 42 of lower riser board 18 make electrical contact with the contact elements 26 (FIGS. 5 and 6) provided on the integrated circuit socket 20. For example, in the embodiment shown and described herein where the integrated circuit socket 20 comprises a land grid array (LGA) socket, the contact pads 44 provided on the second side 42 of the lower riser board 18 are made compatible (e.g., in terms of material, contact pad size, and contact pad pitch) with the contact elements 26 (FIGS. 5 and 6) provided on the LGA socket. However, because such contact pad requirements are known in the art for LGA packages, the details of the contact pads 44 provided on the second side 42 of lower riser board 18 will not be described in further detail herein.

The thickness 48 (FIG. 1) of lower riser board 18 should be selected so that it is sufficient to allow the lower riser board 18 to fully engage or mate with the integrated circuit socket 20 in the manner that will be more fully described below. The thickness 48 should also be sufficient to prevent any components 38 provided on the main board 12 from contacting the device 22 or any devices or components (e.g., the socket 20) provided on the device 22, as best seen in FIG. 1.

Figure 4:
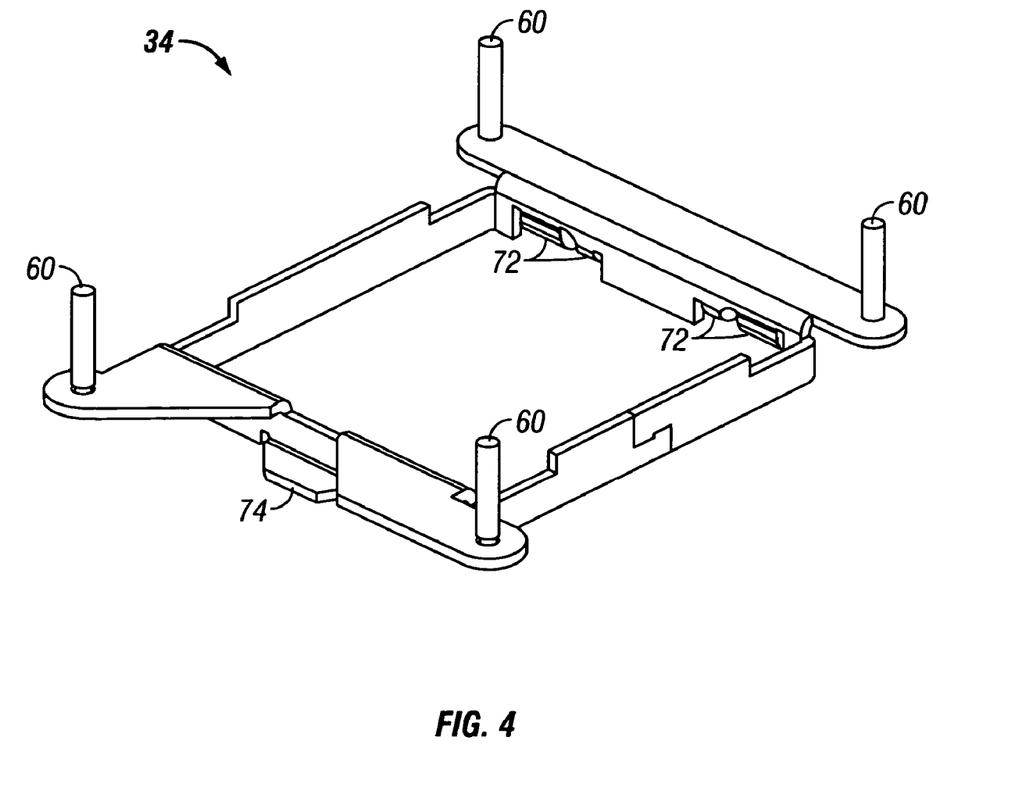
FIG. 4 is a perspective view of the retention frame.
Figure 5:
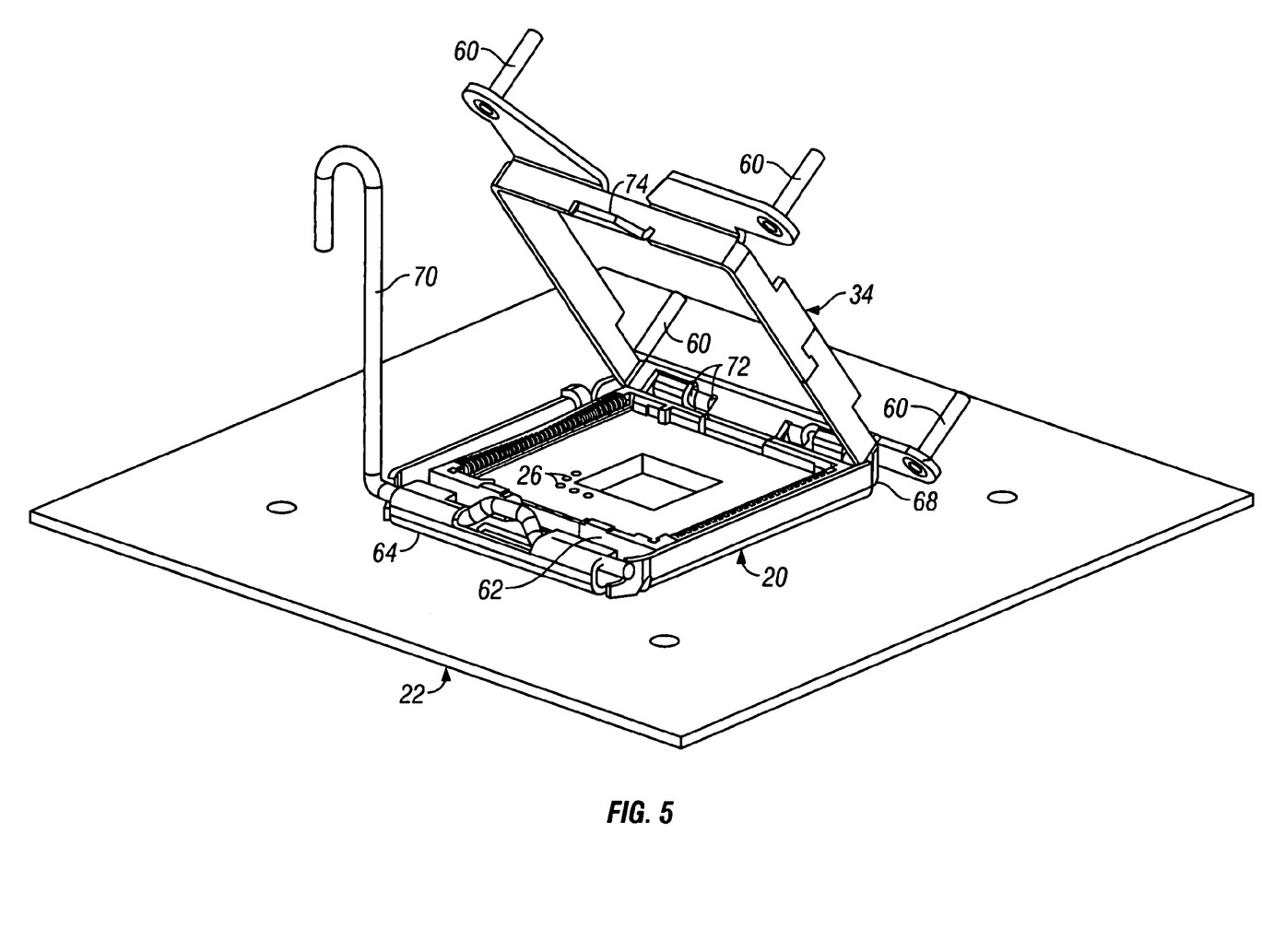
FIG. 5 is a perspective view of the retention frame and integrated circuit socket with the retention frame in the opened position.
Figure 6:
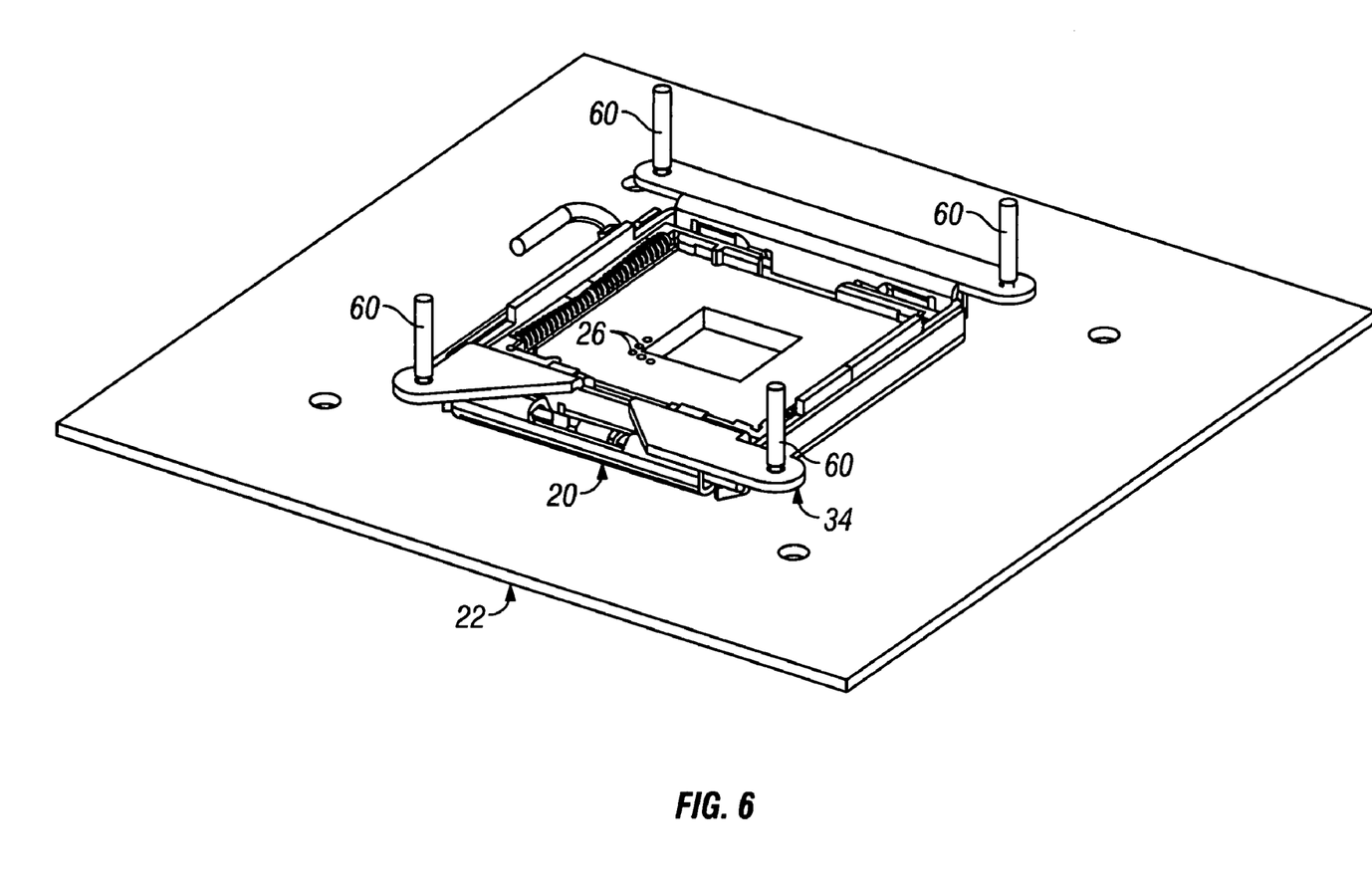
FIG. 6 is a perspective view of the retention frame and integrated circuit socket with the retention frame in the closed position.

With reference now to FIGS. 1 and 4–6, the first side 14 of main board 12 is also provided with a retention frame 34. The retention frame 34 is sized and configured to mate with (i.e., engage) the integrated circuit socket 20 provided on the device 22. In one embodiment wherein the integrated circuit socket 20 comprises an LGA socket, the integrated circuit socket 20 comprises a socket portion 62 and a frame portion 64, as best seen in FIG. 5. The LGA integrated circuit socket 20 may also be provided with a lid (not shown in FIGS. 5 and 6, but similar to a lid 66 provided on integrated circuit socket 32, as best seen in FIGS. 1 and 2). In normal usage with the socket 20, the lid (not shown) is used to secure an integrated circuit package (e.g., package 30 shown in FIG. 1) within the socket 20. In a typical LGA socket, such as integrated circuit socket 20, the lid (not shown) is pivotally mounted to a hinge portion 68 formed in the frame portion 64 of socket 20 so that the lid can be moved between an open position (e.g., to allow an integrated circuit package to be received by the socket 20) and a closed position (e.g., to hold the integrated circuit package securely in position. The lid (not shown) can be locked in the closed position by actuating a latch assembly 70 associated with the socket 20. Accordingly, the lid (not shown) of LGA integrated circuit socket 20 is used to securely hold or clamp an integrated circuit package (not shown) within the socket portion 62 of integrated circuit socket 20.

In order to allow the interposer probe 10 to be engaged with the integrated circuit socket 20 of the device 22, the lid (not shown) of the socket 20 is first removed. The retention frame 34 is then installed in its place. Accordingly, the retention frame 34 is configured to operate with the particular integrated circuit socket 20.

With reference now primarily to FIG. 4, the retention frame 34 of one embodiment comprises a generally rectangular (e.g., square) frame-like structure that is sized to fit over the outer perimeter 50 of integrated circuit socket 20. See FIG. 1. The retention frame 34 is provided with hinge members 72 that are configured to engage the hinge portion 68 provided on the frame portion 64 of the particular integrated circuit socket 20. Retention frame 34 may also be provided with a tab 74 that is sized to engage the latch assembly 70 provided on the frame portion 64 of integrated circuit socket 20. When engaged with the integrated circuit socket 20, the retention frame may be pivoted between an opened position (illustrated in FIG. 5) and a closed position (illustrated in FIG. 6). The retention frame 34 may be locked in the closed position by the latch assembly 70 in the same manner as the lid (not shown) would be.

In one embodiment, the retention frame 34 is also provided with a plurality of threaded studs 60 sized to be received by corresponding through holes (not shown) provided in the main board 12. See FIG. 1. Accordingly, the main board 12 may be readily mounted to the retention frame 34 in the manner that will be described in greater detail below. Alternatively, other arrangements could be used to allow the main board 12 to be mounted to the retention frame 34.

The retention frame 34 may be fabricated from any of a wide range of materials, such as metals or plastics, suitable for the intended application. Consequently, the interposer probe 10 should not be regarded as limited to any particular configuration of retention frame 34 comprising any particular material. However, by way of example, in one embodiment, the retention frame 34 is fabricated from stainless steel.

To sum-up, the arrangement of the main board 12 and lower riser board 18 provides a structure for conducting electrical signals between the main board 12 and the integrated circuit socket 20 provided on the device 22. The retention frame 34 serves to secure the interposer probe 10 to the device 22 being tested and to ensure that a reliable electrical connection is maintained between the lower riser board 18 and the socket 20. Accordingly, the retention frame 34 eliminates the need to provide the device 22 or interposer probe 10 with any additional devices or provisions to secure the interposer probe 10 to the device 22 to test the same.

Referring back now to FIG. 1, the upper riser board 28 is mounted to the second side 16 of the main board 12. In the embodiment shown and described herein, the upper riser board 28 comprises a printed circuit board having a first side 52, a second side 54, and a thickness 56. The first side 52 is provided with a plurality of contact pads (not shown) that are compatible with the particular mounting system used to mount and electrically connect the upper riser board 28 to the second side 16 of main board 12. For example, in one embodiment wherein the first side 52 of the upper riser board 28 is mounted to the second side 16 of the main board 12 by the ball grid array mounting system 46, the contact pads (not shown) provided on the first side 52 of upper riser board 28 are compatible (e.g., from material, size, and spacing standpoints) with the BGA mounting system 46. However, because BGA mounting systems are well-known in the art and could be easily implemented by persons having ordinary skill in the art after having become familiar with the teachings provided herein, the details of the BGA mounting system 46 that may be used to mount the upper riser board 28 to the main board 12 will not be described in further detail herein.

The second side 54 of upper riser board 28 is provided with a plurality electrical contact pads (not shown) that are electrically connected to corresponding contact pads (not shown) provided on the first side 52 of the upper riser board 28. The electrical connections between the various contact pads provide on the first and second sides 52 and 54 of upper riser board 28 may be provided by appropriate circuit paths or traces, such as plated through-holes (not shown), provided in the upper riser board 28. Accordingly, the upper riser board 28 comprises a circuit board or printed wiring board having a plurality of contact pads provided on the first and second sides 52 and 54 thereof that are electrically connected together. Accordingly, the upper riser board 28 may comprise any of a wide variety of printed wiring boards (e.g., epoxy-glass) fabricated in accordance with any of a wide range of processes known in the art or that may be developed in the future. Consequently, the particular construction of the upper riser board 28 that may be used in one example embodiment will not be described in further detail herein.

The thickness 56 of upper riser board 28 should be selected so that it is sufficient to prevent any components 38 provided on the main board 12 from contacting the integrated circuit socket 32. See, for example, FIG. 1.

The contact pads (not shown) provided on the second side 54 of upper riser board 28 should be compatible with the particular integrated circuit socket 32 that is to be used to receive the integrated circuit package 30, i.e., so that the contact pads on the upper riser board 28 make electrical contact with contact pads (not shown) provided on the integrated circuit socket 32. For example, in the embodiment shown and described herein where the integrated circuit socket 32 comprises a land grid array (LGA) socket, the contact pads (not shown) provided on the second side 54 of the upper riser board 28 are made compatible with the LGA socket as well as on the particular mounting system that is to be used to attach the socket 32. In one embodiment, the integrated circuit socket 32 is mounted to and electrically connected with the upper riser board 28 by means of a BGA mounting system 46. However, because BGA mounting systems are well-known in the art and could be easily implemented by persons having ordinary skill in the art after having become familiar with the teachings provided herein, the details of the BGA mounting system 46 that may be used to mount the integrated circuit socket 32 to the upper riser board 28 will not be described in further detail herein.

To summarize, the arrangement of the main board 12, upper riser board 28, and integrated circuit socket 32 provides a structure for conducting electrical signals between the main board 12 and the integrated circuit package 30 inserted into the socket 32.

As was briefly described above, the interposer probe 10 may be used to probe the device 22 to be tested by positioning the interposer probe 10 with respect to the device 22 so that the lower riser board 18 is inserted into the integrated circuit socket 20 of the device 22. In the embodiment shown and described herein, this is accomplished by removing the lid (not shown) on the integrated circuit socket 20 on the device 22. The retention frame 34 is then mounted in place of the lid and moved to the closed position (illustrated in FIG. 6). The latch assembly 70 of the integrated circuit socket 20 may then be used to securely hold the retention frame 34 to the socket 20. The main board 12 may then be mounted to the retention frame 34, such as, for example, by inserting the various threaded studs 60 into corresponding through-holes provided in the main board 12. In so doing, the lower riser board 18 provided on the main board 12 will be aligned with the socket portion 62 of integrated circuit socket 20. The main board 12 may then be fully secured to the retention frame 34 by threading corresponding nuts 76 on the threaded studs 60. As the nuts 76 are tightened, the lower riser board 18 will be caused to become fully engaged or inserted into the socket 20. Accordingly, the lower riser board 18 will electrically connect the integrated circuit socket 20 of the device 22 with the main board 12, as explained above.

The integrated circuit package 30 that normally would be received by the integrated circuit socket 20 on device 22 is inserted into the integrated circuit socket 32 of the interposer probe 10. For example, in the embodiment shown and described herein wherein the integrated circuit socket 32 comprises an LGA socket, the integrated circuit package 30 is securely held within the integrated circuit socket 32 by a lid 66 which may be provided to the socket 32. The integrated circuit package 30 is thus electrically connected to the main board 12 via the upper riser board 28. Accordingly, electrical signals will be capable of passing between the integrated circuit package 30, the main board 12 (including any circuit tester or logic analyzer that may be connected to the main board), and the device 22 to be tested.

As mentioned above, in one embodiment, the main board 12 is electrically connected to an external circuit tester or logic analyzer (not shown) via one or more cables 36. Thereafter, the external circuit tester may test the device 22, including the integrated circuit package 30, via the interposer probe 10.

Having herein set forth preferred embodiments of the present invention, it is anticipated that suitable modifications can be made thereto which will nonetheless remain within the scope of the invention. The invention shall therefore only be construed in accordance with the following claims:

The invention claimed is:

1. An interposer probe, comprising:
    a main board having a first side and a second side;
    a lower riser board mounted to the first side of said main board and in electrical contact therewith, said lower riser board being configured to engage an integrated circuit socket on a device to be tested;
    an upper riser board mounted to the second side of said main board and in electrical contact therewith, said upper riser board being configured to receive an integrated circuit package; and
    a retention frame mounted to the first side of said main board, said retention frame engaging the integrated circuit socket on the device to be tested.

2. The interposer probe of claim 1, wherein said upper riser board comprises a first side and a second side, the first side of said upper riser board being mounted to the second side of said main board, said interposer probe further comprising a socket mounted to the second side of said upper riser board, said socket receiving the integrated circuit package.

3. The interposer probe of claim 1, wherein said lower riser board comprises a first side and a second side, the first side of said lower riser board being mounted to the first side of said main board, the second side of said lower riser board being received by the integrated circuit socket on the device to be tested.

4. The interposer probe of claim 1, wherein the integrated circuit socket on the device to be tested comprises a land grid array socket and wherein said lower riser board is configured to electrically interface with the land grid array socket.

5. The interposer probe of claim 4, wherein the integrated circuit package comprises a land grid array package and wherein said upper riser board is configured to electrically interface with the land grid array package.

6. The interposer probe of claim 1, further comprising at least one electronic component mounted on said main board.

7. The interposer probe of claim 6, wherein said at least one electronic component is mounted to the first side of said main board and wherein said lower riser board has a thickness, the thickness of said lower riser board being sufficient to prevent said at least one electronic component from contacting the device to be tested.

8. The interposer probe of claim 6, wherein said at least one electronic component is mounted to the second side of said main board and wherein said upper riser board has a thickness, the thickness of said upper riser board being sufficient to prevent said at least one electronic component from contacting the integrated circuit package.

9. The interposer probe of claim 1, wherein said lower riser board is mounted to the first side of said main board by a ball grid array mounting system.

10. The interposer probe of claim 1, wherein said upper riser board is mounted to the second side of said main board by a ball grid array mounting system.

11. An interposer probe, comprising:
    a main board having a first side and a second side;
    a lower riser board having a first side and a second side, the first side of said lower riser board being mounted to the first side of said main board, so that said lower riser board is electrically connected to said main board, the second side of said lower riser board being adapted to be received by an integrated circuit socket on a device to be tested so that the integrated circuit socket on the device to be tested is electrically connected to said main board via said lower riser board;
    an upper riser board having a first side and a second side, the first side of said upper riser board being mounted to the second side of said main board so that said upper riser board is electrically connected to said main board;
    an integrated circuit socket mounted to the second side of said upper riser board so that the integrated circuit socket is electrically connected to the main board via the upper riser board, said integrated circuit socket being adapted to receive an integrated circuit package; and
    a retention frame mounted to the first side of said main board, said retention frame engaging the integrated circuit socket on the device to be tested, said retention frame holding the second side of said lower riser board in electrical contact with the integrated circuit socket on the device to be tested.

12. The interposer probe of claim 11, wherein the first side of said upper riser board is mounted to the second side of said main board by a ball grid array mounting system.

13. The interposer probe of claim 11, wherein the integrated circuit socket is mounted to the second side of said upper riser board by a ball grid array mounting system.

14. The interposer probe of claim 11, wherein the first side of said lower riser board is mounted to the first side of said main board by a ball grid array mounting system.

15. The interposer probe of claim 11, wherein said integrated circuit socket comprises a land grid array socket.

16. The interposer probe of claim 11, wherein the integrated circuit socket on the device to be tested comprises a land grid array socket and wherein the second side of said lower riser board is configured to be received by the land grid array socket on the device to be tested.

17. The interposer probe of claim 11, further comprising at least one electrical component mounted to the first side of said main board, and wherein said lower riser board has a thickness, the thickness of said lower riser board being sufficient to prevent said at least one electrical component from contacting the device to be tested when the second side of said lower riser board is received by the integrated circuit socket on the device to be tested.

18. The interposer probe of claim 11, further comprising at least one electrical component mounted to the second side of said main board, and wherein said upper riser board has a thickness, the thickness of said upper riser board being sufficient to prevent said at least one electrical component from contacting the integrated circuit package when said integrated circuit package is received by said integrated circuit socket.

19. A method for testing a device having at least one integrated circuit socket, comprising:

providing an interposer probe having a first side and a second side, the first side of said interposer probe having a lower riser board and a retention frame mounted thereto, the lower riser board being configured to be received by the integrated circuit socket on the device, the second side of said interposer probe having an upper riser board mounted thereto, the upper riser board being configured to receive an integrated circuit socket thereon configured to receive an integrated circuit package;

engaging the lower riser board of the interposer probe and the integrated circuit socket on the device with the retention frame;

engaging the integrated circuit package with the integrated circuit socket on the interposer probe; and using the interposer probe to probe at least one electrical signal between the integrated circuit package and the device.

20. The method of claim 19, further comprising:

operatively connecting the interposer probe with a logic analyzer; and using the logic analyzer to test the device.

* * * * *